United States Patent
Li et al.

(10) Patent No.: US 10,803,631 B2
(45) Date of Patent: Oct. 13, 2020

(54) SYSTEMS AND METHODS FOR MAGNETIC RESONANCE IMAGING

(71) Applicant: SHANGHAI UNITED IMAGING HEALTHCARE CO., LTD., Shanghai (CN)

(72) Inventors: Guobin Li, Shanghai (CN); Nan Liu, Shanghai (CN); Jinguang Zong, Shanghai (CN); Xiaoqian Huang, Shanghai (CN); Shu Liao, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 0 days.

(21) Appl. No.: 16/390,284

(22) Filed: Apr. 22, 2019

(65) Prior Publication Data
US 2020/0202586 A1    Jun. 25, 2020

(30) Foreign Application Priority Data

Dec. 20, 2018 (CN) .......................... 2018 1 1564525

(51) Int. Cl.
| | |
|---|---|
| *G01V 3/00* | (2006.01) |
| *G06T 11/00* | (2006.01) |
| *G01R 33/48* | (2006.01) |
| *G01R 33/56* | (2006.01) |
| *G06N 3/08* | (2006.01) |
| *G01R 33/561* | (2006.01) |

(52) U.S. Cl.
CPC ........ *G06T 11/003* (2013.01); *G01R 33/4818* (2013.01); *G01R 33/5608* (2013.01); *G01R 33/5611* (2013.01); *G06N 3/08* (2013.01); *G06T 2211/421* (2013.01); *G06T 2211/424* (2013.01)

(58) Field of Classification Search
USPC ......................................................... 324/309
See application file for complete search history.

(56) References Cited

U.S. PATENT DOCUMENTS

| | | |
|---|---|---|
| 7,688,068 B2 | 3/2010 | Beatty |
| 9,989,607 B2 | 6/2018 | Meyer et al. |
| 2018/0232878 A1 | 8/2018 | Braun et al. |

(Continued)

OTHER PUBLICATIONS

Christine Preibisch et al., Comparison of Parallel Acquisition Techniques Generalized Autocalibrating Partially Parallel Acquisitions (GRAPPA) and Modified Sensitivity Encoding (mSENSE) in Functional MRI (fMRI) at 3T, Journal of Magnetic Resonance Imaging, 27: 590-598, 2008.

(Continued)

*Primary Examiner* — Rodney E Fuller
(74) *Attorney, Agent, or Firm* — Metis IP LLC

(57) ABSTRACT

A method for magnetic resonance imaging may include acquiring first k-space data that is generated by entering acquired magnetic resonance (MR) data into a plurality of first k-space locations. The method may further include synthesizing second k-space data for a plurality of second k-space locations that are not filled with the acquired MR data. The method may further include reconstructing an image from the first k-space data and the second k-space data by applying a reconstruction algorithm. The reconstruction algorithm is based at least in part on a neural network technique.

20 Claims, 11 Drawing Sheets

(56) References Cited

U.S. PATENT DOCUMENTS

| | | | | |
|---|---|---|---|---|
| 2019/0347772 A1* | 11/2019 | Zhang | ............... | G06T 5/002 |
| 2019/0369190 A1* | 12/2019 | Ye | ............... | G01R 33/561 |
| 2020/0008701 A1* | 1/2020 | Ye | ............... | A61B 5/055 |
| 2020/0011951 A1* | 1/2020 | Shi | ............... | G01R 33/5611 |
| 2020/0026967 A1* | 1/2020 | Kartoun | ............... | G06N 3/08 |
| 2020/0090382 A1* | 3/2020 | Huang | ............... | G06T 11/006 |
| 2020/0167975 A1* | 5/2020 | Popescu | ............... | G06T 11/005 |
| 2020/0175675 A1* | 6/2020 | Ogino | ............... | G06T 5/001 |

OTHER PUBLICATIONS

Michael Lustig et al., Sparse MRI: The Application of Compressed Sensing for Rapid MR Imaging, Magnetic Resonance in Medicine, 58: 1182-1195, 2007.

Daniel K. Sodickson et al., Simultaneous Acquisition of Spatial Harmonics (SMASH): Fast Imaging with Radiofrequency Coil Arrays, Magnetic Resonance in Medicine, 38: 591-603, 1997.

Klaas P. Pruessmann et al., SENSE: Sensitivity Encoding for Fast MRI, Magnetic Resonance in Medicine, 42: 952-962, 1999.

E. M. Haacke et al., A Fast, Iterative, Partial-Fourier Technique Capable of Local Phase Recovery, Journal of Magnetic Resonance Imaging, 92: 126-145, 1991.

Mark A. Griswold et al., Generalized Autocalibrating Partially Parallel Acquisitions (GRAPPA), Magnetic Resonance in Medicine, 47: 1202-1210, 2002.

* cited by examiner

SYSTEMS AND METHODS FOR MAGNETIC RESONANCE IMAGING

CROSS-REFERENCE TO RELATED APPLICATIONS

This present application claims priority of Chinese Application No. 201811564525.2 filed on Dec. 20, 2018, the entire contents of which are incorporated herein by reference.

TECHNICAL FIELD

The disclosure generally relates to magnetic resonance imaging systems and methods, and more particularly, relates to systems and methods for magnetic resonance image reconstruction.

BACKGROUND

Magnetic Resonance Imaging (MRI) is a useful medical imaging modality that uses the magnetic resonance for imaging. It is non-invasive, non-ionizing, non-radiative, and can be applied to various fields, including the imaging of human anatomy, blood flow and/or metabolism information. However, the imaging speed of MRI is relatively slow. Sometimes, it may take a few minutes to perform an MRI scanning, which limits the temporal and spatial resolution of the image to be reconstructed. Therefore, it is desired to provide an image reconstruction technique for MRI to reduce the time for scanning and maintain a good image quality.

SUMMARY

According to an aspect of the present disclosure, a system for magnetic resonance imaging is provided. The system may include at least one storage medium storing a set of instructions and at least one processor configured to communicate with the at least one storage medium. When executing the set of instructions, the at least one processor may be directed to cause the system to acquire first k-space data. The first k-space data may be generated by entering acquired magnetic resonance (MR) data into a plurality of first k-space locations. The at least one processor may be further directed to cause the system to synthesize second k-space data for a plurality of second k-space locations based on the first k-space data. The second k-space locations may not be filled with the acquired MR data. The at least one processor may be further directed to cause the system to reconstruct an image from the first k-space data and the second k-space data by applying a reconstruction algorithm. The reconstruction algorithm may be based at least in part on a neural network technique.

In some embodiments, the reconstruction algorithm may be also based on a non-neural network technique that is applied prior to or after the application of the neural network technique.

In some embodiments, the non-neural network technique may include a parallel imaging technique or a compressed sensing technique In some embodiments, the second k-space data may be synthesized according to one or more techniques including a partial Fourier imaging technique, a parallel imaging technique, or a regridding technique.

In some embodiments, to synthesize second k-space data for a plurality of second k-space locations based on the first k-space data, the at least one processor may be directed to cause the system to determine, among a plurality of k-space data adjustment techniques, an optimized k-space data adjustment technique. The at least one processor may be further directed to cause the system to synthesize the second k-space data based on the optimized k-space data adjustment technique.

In some embodiments, to determine, among a plurality of k-space data adjustment techniques, an optimized k-space data adjustment technique, the at least one processor may be directed to cause the system to obtain a set of reference k-space data. The at least one processor may be further directed to cause the system to generate a set of undersampled k-space data based on the set of reference k-space data. The at least one processor may be further directed to cause the system to adjust, according to each of the plurality of k-space data adjustment techniques, the set of undersampled k-space data to obtain a set of adjusted k-space data. The at least one processor may be further directed to cause the system to select, from the plurality of k-space data adjustment techniques, the optimized k-space data adjustment technique based on the plurality of sets of adjusted k-space data.

In some embodiments, to select, from the plurality of k-space data adjustment techniques, the optimized k-space data adjustment technique based on the plurality of sets of adjusted k-space data, the at least one processor may be directed to cause the system to input each of the plurality of sets of adjusted k-space data into at least one neural network model to generate a result image. The at least one processor may be further directed to cause the system to generate a reference image based on the set of reference k-space data. The at least one processor may be further directed to cause the system to determine the optimized k-space data adjustment technique by comparing the plurality of result images with the reference image.

In some embodiments, the at least one neural network model includes at least two different neural network models, and to input each of the plurality of sets of adjusted k-space data into at least one neural network model to generate a result image, the at least one processor may be directed to cause the system to input each of the plurality of sets of adjusted k-space data into one of the at least two different neural network models to generate its corresponding result image.

In some embodiments, the at least one neural network model may include an artificial neural network (ANN) model.

In some embodiments, to determine the optimized k-space data adjustment technique by comparing the plurality of result images with the reference image, the at least one processor may be directed to cause the system to generate, for each of the plurality of result images, a mean square error between pixels of the each result image and pixels of the reference image by comparing the each result image and the reference image. The at least one processor may be further directed to cause the system to determine, based on the mean square errors, the optimized k-space data adjustment technique.

In some embodiments, to acquire first k-space data that is generated by entering acquired MR data into a plurality of first k-space locations, the at least one processor may be directed to cause the system to sample the plurality of first k-space locations of the first k-space data according to one or more trajectories including a Cartesian sampling trajectory, a spiral sampling trajectory, or a radial sampling trajectory.

In some embodiments, the first k-space data and the second k-space data may jointly form a center portion of k-space that is fully sampled.

According to another aspect of the present disclosure, a system for magnetic resonance imaging is provided. The system may include at least one storage medium storing a set of instructions and at least one processor configured to communicate with the at least one storage medium. When executing the set of instructions, the at least one processor may be directed to cause the system to obtain a set of reference k-space data. The at least one processor may be further directed to cause the system to generate a set of undersampled k-space data based on the set of reference k-space data. The at least one processor may be further directed to cause the system to obtain a plurality of k-space data adjustment techniques. The at least one processor may be further directed to cause the system to adjust, according to each of the plurality of k-space data adjustment techniques, the set of undersampled k-space data to obtain a set of adjusted k-space data. The at least one processor may be further directed to cause the system to select, from the plurality of k-space data adjustment techniques, an optimized k-space data adjustment technique based on the plurality of sets of adjusted k-space data.

In some embodiments, to select, from the plurality of k-space data adjustment techniques, an optimized k-space data adjustment technique based on the plurality of sets of adjusted k-space data, the at least one processor may be directed to cause the system to reconstruct an image from each of the plurality of sets of adjusted k-space data by applying a reconstruction algorithm. The reconstruction algorithm may be based at least in part on a neural network technique. The at least one processor may be further directed to cause the system to generate a reference image based on the set of reference k-space data. The at least one processor may be further directed to cause the system to determine the optimized k-space data adjustment technique by comparing the plurality of images with the reference image.

In some embodiments, the neural network technique may include at least two different neural network models, and to reconstruct an image from each of the plurality of sets of adjusted k-space data by applying a reconstruction algorithm, the at least one processor may be directed to cause the system to input each of the plurality of sets of adjusted k-space data into one of the at least two different neural network models to generate its corresponding image.

In some embodiments, the neural network technique may include an artificial neural network (ANN) model.

In some embodiments, to determine the optimized k-space data adjustment technique by comparing the plurality of images with the reference image, the at least one processor may be directed to cause the system to generate, for each of the plurality of images, a mean square error between pixels of the each image and pixels of the reference image by comparing the each image and the reference image. The at least one processor may be further directed to cause the system to determine, based on the mean square errors, the optimized k-space data adjustment technique.

In some embodiments, the optimized k-space data adjustment technique may be used to synthesize, based on first k-space data that is generated by entering acquired magnetic resonance (MR) data into a plurality of first k-space locations, second k-space data for a plurality of second k-space locations that are not filled with the acquired MR data.

In some embodiments, the reconstruction algorithm may be also based on a non-neural network technique that is applied prior to or after the application of the neural network technique.

In some embodiments, the non-neural network technique may include a parallel imaging technique or a compressed sensing technique In some embodiments, the plurality of k-space data adjustment techniques may include a partial Fourier imaging technique, a parallel imaging technique, or a regridding technique.

In some embodiments, to obtain a set of reference k-space data, the at least one processor may be directed to cause the system to sample the set of reference k-space data according to one or more trajectories including a Cartesian sampling trajectory, a spiral sampling trajectory, or a radial sampling trajectory.

According to another aspect of the present disclosure, a method for magnetic resonance imaging is provided. The method may include acquiring first k-space data that is generated by entering acquired magnetic resonance (MR) data into a plurality of first k-space locations. The method may also include synthesizing, based on the first k-space data, second k-space data for a plurality of second k-space locations that are not filled with the acquired MR data. The method may further include reconstructing an image from the first k-space data and the second k-space data by applying a reconstruction algorithm. The reconstruction algorithm may be based at least in part on a neural network technique.

According to still another aspect of the present disclosure, a method for magnetic resonance imaging is provided. The method may include obtaining a set of reference k-space data. The method may also include generating a set of undersampled k-space data based on the set of reference k-space data. The method may further include obtaining a plurality of k-space data adjustment techniques. The method may further include adjusting, according to each of the plurality of k-space data adjustment techniques, the set of undersampled k-space data to obtain a set of adjusted k-space data. The method may further include selecting, from the plurality of k-space data adjustment techniques, an optimized k-space data adjustment technique based on the plurality of sets of adjusted k-space data.

According to a further aspect of the present disclosure, a non-transitory computer readable medium is provided. The non-transitory computer readable medium may store instructions, and the instructions, when executed by a computer, may cause the computer to implement a method. The method may include one or more of the following operations. The method may include acquiring first k-space data that is generated by entering acquired magnetic resonance (MR) data into a plurality of first k-space locations. The method may also include synthesizing, based on the first k-space data, second k-space data for a plurality of second k-space locations that are not filled with the acquired MR data. The method may further include reconstructing an image from the first k-space data and the second k-space data by applying a reconstruction algorithm. The reconstruction algorithm may be based at least in part on a neural network technique.

According to a further aspect of the present disclosure, a non-transitory computer readable medium is provided. The non-transitory computer readable medium may store instructions, and the instructions, when executed by a computer, may cause the computer to implement a method. The method may include obtaining a set of reference k-space data. The method may also include generating a set of undersampled k-space data based on the set of reference k-space data. The method may further include obtaining a plurality of k-space data adjustment techniques. The method may further include adjusting, according to each of the plurality of k-space data adjustment techniques, the set of undersampled k-space data to obtain a set of adjusted k-space data. The method may further include selecting, from the plurality of k-space data adjustment techniques, an optimized k-space data adjustment technique based on the plurality of sets of adjusted k-space data.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein.

DETAILED DESCRIPTION

Figure 1:
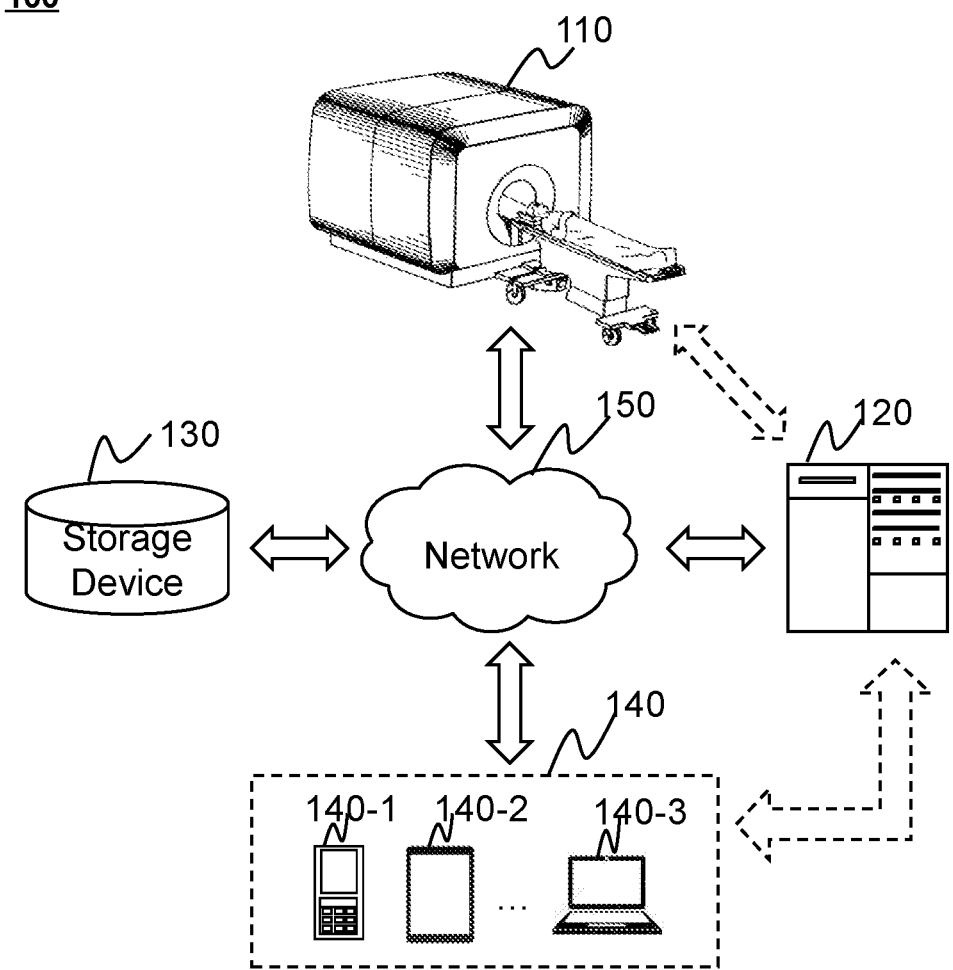
FIG. 1 is a schematic diagram illustrating an exemplary imaging system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "unit," "module," and/or "block" used herein are one method to distinguish different components, elements, parts, section or assembly of different level in ascending order. However, the terms may be displaced by another expression if they achieve the same purpose.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices (e.g., processing unit 320 as illustrated in FIG. 3) may be provided on a computer readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included of connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage.

It will be understood that when a unit, engine, module or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

Provided herein are systems and methods for MRI. A system for MRI may obtain MR data acquired from an MR scanner, and reconstruct an image based on the acquired MR data. For example, the system may enter the acquired MR data into a plurality of first k-space locations to generate first k-space data. Then, the system may synthesize second k-space data for a plurality of second k-space locations that are not filled with the acquired MR data. The system may further reconstruct an MR image from the first k-space data and the second k-space data by an application of a reconstruction algorithm. The reconstruction algorithm may be based at least in part on a neural network technique.

In one aspect, provided that the second k-space data is synthesized based on the acquired MR data, the time for collecting the unacquired MR data (i.e., the second k-space data) from the scanner is saved, thus reducing the entire time for the image reconstruction. In another aspect, the utilization of the reconstruction algorithm, which is based in part on a neural network technique, may facilitate the reconstruction of the MR image. Moreover, compared with the first k-space data alone, the combination of the first k-space data and the second k-space data may provide more information that contributes to the reconstruction of a high quality image.

FIG. 1 is a schematic diagram illustrating an exemplary imaging system 100 according to some embodiments of the present disclosure. As shown, the imaging system 100 may include an MR scanner 110, a processing device 120, a storage device 130, one or more terminals 140, and a network 150. The components in the imaging system 100 may be connected in one or more of various ways. Merely by way of example, as illustrated in FIG. 1, the MR scanner 110 may be connected to the processing device 120 through the network 150. As another example, the MR scanner 110 may be connected with the processing device 120 directly as indicated by the bi-directional arrow in dotted lines linking the MR scanner 110 and the processing device 120. As a further example, the storage device 130 may be connected with the processing device 120 directly (not shown in FIG. 1) or through the network 150. As still a further example, one or more terminals 140 may be connected with the processing device 120 directly (as indicated by the bi-directional arrow in dotted lines linking the terminal(s) 140 and the processing device 120) or through the network 150.

The MR scanner 110 may scan a (part of) subject and generate MR signals relating to the (part of) subject. In the present disclosure, the terms "subject" and "object" are used interchangeably. In some embodiments, the subject may include a body, a substance, or the like, or a combination thereof. In some embodiments, the subject may include a specific portion of a body, such as the head, the thorax, the abdomen, or the like, or a combination thereof. In some embodiments, the subject may include a specific organ, such as the heart, the esophagus, the trachea, the bronchus, the stomach, the gallbladder, the small intestine, the colon, the bladder, the ureter, the uterus, the fallopian tube, etc. In some embodiments, the subject may include a region of interest (ROI) in the specific organ (e.g., a tumor). The MR scanner 110 may include a magnet assembly, a gradient coil assembly, and a radiofrequency (RF) coil assembly.

The magnet assembly may generate a first magnetic field (also referred to as a main magnetic field) for polarizing the subject to be scanned. The magnet assembly may include a permanent magnet, a superconducting electromagnet, a resistive electromagnet, etc. The gradient coil assembly may generate a second magnetic field (also referred to as a gradient magnetic field). The gradient coil assembly may include X-gradient coils, Y-gradient coils, and Z-gradient coils. The gradient coil assembly may generate one or more magnetic field gradient pulses to the main magnetic field in the X direction (Gx), Y direction (Gy), and Z direction (Gz) to encode the spatial information of the subject. In some embodiments, the X direction may be designated as a frequency encoding direction, while the Y direction may be designated as a phase encoding direction. In some embodiments, Gx may be used for frequency encoding or signal readout, generally referred to as frequency encoding gradient or readout gradient. In some embodiments, Gy may be used for phase encoding, generally referred to as phase encoding gradient. In some embodiments, Gz may be used for slice selection for obtaining 2D k-space data based on MR signals. Gz may be used for phase encoding for obtaining 3D k-space data based on MR signals.

The RF coil assembly may include a plurality of RF coils. The RF coils may include one or more RF transmit coils and/or one or more RF receiver coils. The RF transmit coil(s) may transmit RF pulses to the subject. Under the coordinated action of the main magnetic field, the gradient magnetic field, and the RF pulses, MR signals relating to the subject may be generated according to a pulse sequence. The RF receiver coils may acquire MR signals from the subject according to the pulse sequence. The pulse sequence may be defined by imaging parameters and arrangement associated with the image parameters in time sequence. Exemplary pulse sequences may include a spin echo sequence, a gradient echo sequence, a diffusion sequence, an inversion recovery sequence, or the like, or a combination thereof. For example, the spin echo sequence may include a fast spin echo (FSE), a turbo spin echo (TSE), a rapid acquisition with relaxation enhancement (RARE), a half-Fourier acquisition single-shot turbo spin-echo (HASTE), a turbo gradient spin echo (TGSE), or the like, or a combination thereof.

The MR signals may also be referred to as echo signals. The MR signals may be used to fill a k-space based on a sampling technique. Exemplary sampling techniques may include a Cartesian sampling technique, a spiral sampling technique, a radial sampling technique, a Z-sampling technique, an undersampling technique, etc. The received MR signal(s) may be sent to the processing device 120 directly or via the network 150 for image reconstruction and/or image processing. In some embodiments, the MR scanner 110 may include an analog-to-digital converter (ADC) (shown in FIG. 2). The analog-to-digital converter may convert MR signals received by one or more RF receiver coils into digital data. The digital data may be used to fill a k-space to generate k-space data. The analog-to-digital converter may be a direct-conversion ADC, a successive-approximation ADC, a ramp-compare ADC, a Wilkinson ADC, an integrating ADC, a delta-encoded ADC, a pipeline ADC, a sigma-delta ADC, or the like, or a combination thereof.

The processing device 120 may process data and/or information acquired from the MR scanner 110, the terminal(s) 140, and/or the storage device 130. For example, the processing device 120 may acquire first k-space data based on MR signals. The processing device 120 may also determine an optimized k-space data adjustment technique to adjust the first k-space data. In some embodiments, the processing device 120 may synthesize second k-space data based on the optimized k-space data adjustment technique and the first k-space data. The processing device 120 may reconstruct an MR image based on the first k-space data and the synthesized second k-space data based on a reconstruction algorithm.

In some embodiments, the processing device 120 may be a computer, a user console, a single server or a server group, etc. The server group may be centralized or distributed. In some embodiments, the processing device 120 may be local or remote. For example, the processing device 120 may access information and/or data stored in the MR scanner 110, the terminal(s) 140, and/or the storage device 130 via the network 150. As another example, the processing device 120 may be directly connected to the MR scanner 110, the terminal(s) 140 and/or the storage device 130 to access stored information and/or data. In some embodiments, the processing device 120 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

The storage device 130 may store data, instructions, and/or any other information. In some embodiments, the storage device 130 may store data obtained from the terminal(s) 140 and/or the processing device 120. The data may include image data acquired by the MR scanner 110, image data acquired by the processing device 120, algorithms and/or models for processing the image data, etc. For example, the storage device 130 may store image data (e.g., MR data, k-space data, a MR complex diagram, an MR phase diagram, a field map, etc.) acquired by the MR scanner 110. As another example, the storage device 130 may store one or more algorithms for processing the image data, a target machine learning model for generating susceptibility distribution, etc. In some embodiments, the storage device 130 may store data and/or instructions that the processing device 120 may execute or use to perform exemplary methods/systems described in the present disclosure. In some embodiments, the storage device 130 may include mass storage, removable storage, volatile read-and-write memory, read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memories may include a random access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (EPROM), an electrically erasable programmable ROM (EEPROM), a compact disk ROM (CD-ROM), and a digital versatile disk ROM, etc. In some embodiments, the storage device 130 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 130 may be connected to the network 150 to communicate with one or more other components in the imaging system 100 (e.g., the processing device 120, the terminal(s) 140, etc.). One or more components in the imaging system 100 may access the data or instructions stored in the storage device 130 via the network 150. In some embodiments, the storage device 130 may be directly connected to or communicate with one or more other components in the imaging system 100 (e.g., the processing device 120, the terminal(s) 140, etc.). In some embodiments, the storage device 130 may be part of the processing device 120.

The terminal(s) 140 may include a mobile device 140-1, a tablet computer 140-2, a laptop computer 140-3, or the like, or any combination thereof. In some embodiments, the mobile device 140-1 may include a smart home device, a wearable device, a mobile device, a virtual reality device, an augmented reality device, or the like, or any combination thereof. In some embodiments, the smart home device may include a smart lighting device, a control device of an intelligent electrical apparatus, a smart monitoring device, a smart television, a smart video camera, an interphone, or the like, or any combination thereof. In some embodiments, the wearable device may include a bracelet, a footgear, eyeglasses, a helmet, a watch, clothing, a backpack, a smart accessory, or the like, or any combination thereof. In some embodiments, the mobile device may include a mobile phone, a personal digital assistant (PDA), a gaming device, a navigation device, a point of sale (POS) device, a laptop, a tablet computer, a desktop, or the like, or any combination thereof. In some embodiments, the virtual reality device and/or the augmented reality device may include a virtual reality helmet, virtual reality glasses, a virtual reality patch, an augmented reality helmet, augmented reality glasses, an augmented reality patch, or the like, or any combination thereof. For example, the virtual reality device and/or the augmented reality device may include a Google Glass™, an Oculus Rift™, a Hololens™, a Gear VR™, etc. In some embodiments, the terminal(s) 140 may be part of the processing device 120.

In some embodiments, the terminal(s) 140 may send and/or receive information relating to MR image reconstruction to the processing device 120 via a user interface. The user interface may be configured to facilitate communication between the terminals) 140 and a user associated with the terminal(s) 140. In some embodiments, the user interface may receive an input of a request for MR image reconstruction from the user through, for example, a screen. The terminal(s) 140 may send the request for MR image reconstruction to the processing device 120 via the user interface.

The processing device 120 may obtain first k-space data from the MR scanner 110, and/or the storage device 130. The processing device 120 may further generate second k-space data and reconstruct an MR image based on the first k-space data and the second k-space data.

In some embodiments, the user interface may receive a signal from the processing device 120. In some embodiments, the signal may be configured to cause the terminal(s) 140 to display the MR image to the user.

The network 150 may include any suitable network that can facilitate the exchange of information and/or data for the imaging system 100. In some embodiments, one or more components of the MR scanner 110, the terminal(s) 140, the processing device 120, the storage device 130, etc., may communicate information and/or data with one or more other components of the imaging system 100 via the network 150. For example, the processing device 120 may obtain data from the MR scanner 110 via the network 150. As another example, the processing device 120 may obtain user instructions from the terminal(s) 140 via the network 150. The network 150 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, switches, server computers, and/or any combination thereof. Merely by way of example, the network 150 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 150 may include one or more network access points. For example, the network 150 may include wired and/or wireless network access points such as base stations and/or internet exchange points through which one or more components of the imaging system 100 may be connected to the network 150 to exchange data and/or information.

It should be noted that the above description of the imaging system 100 is merely provided for the purposes of illustration, and not intended to limit the scope of the present disclosure. For persons having ordinary skills in the art, multiple variations and modifications may be made under the teachings of the present disclosure. For example, the assembly and/or function of the imaging system 100 may be varied or changed according to specific implementation scenarios.

Figure 2:
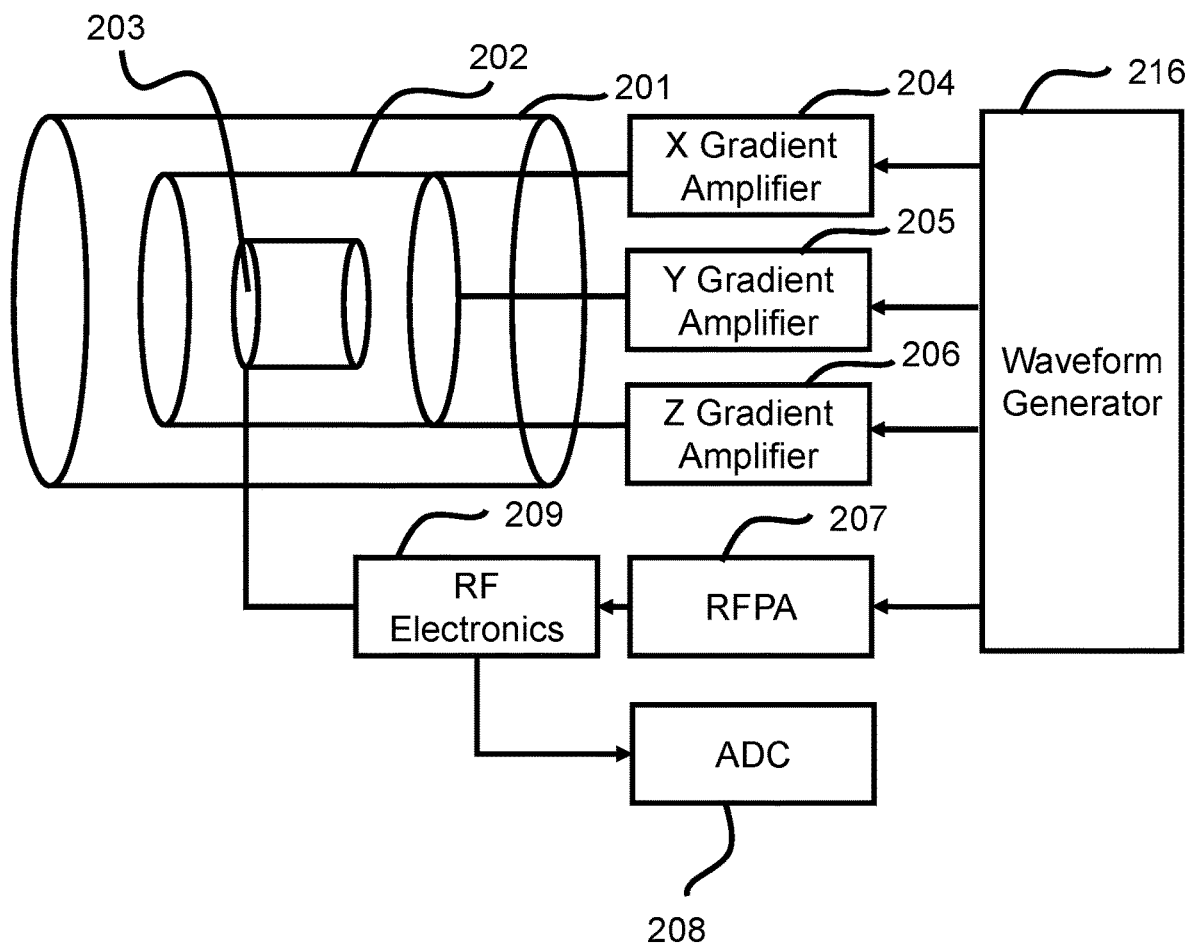
FIG. 2 illustrates a system diagram of an exemplary MR scanner according to some embodiments of the present disclosure.

FIG. 2 is a schematic diagram illustrating an exemplary MR scanner 110 according to some embodiments of the present disclosure. As illustrated, the main magnet 201 may generate a first magnetic field (or referred to as a main magnetic field) that may be applied to an object (also referred to as a subject) exposed inside the field. The main magnet 201 may include a resistive magnet or a superconductive magnet that both need a power supply (not shown) for operation. Alternatively, the main magnet 201 may include a permanent magnet. The main magnet 201 may include a bore that the object is place within. The main magnet 201 may also control the homogeneity of the generated main magnetic field. Some shim coils may be in the main magnet 201. The shim coils placed in the gap of the main magnet 201 may compensate for the inhomogeneity of the magnetic field of the main magnet 201. The shim coils may be energized by a shim power supply.

Gradient coils 202 may be located inside the main magnet 201. The gradient coils 202 may generate a second magnetic field (or referred to as a gradient field, including gradient fields Gx, Gy, and Gz). The second magnetic field may be superimposed on the main field generated by the main magnet 201 and distort the main field so that the magnetic orientations of the protons of an object may vary as a function of their positions inside the gradient field, thereby encoding spatial information into MR signals generated by the region of the object being imaged. The gradient coils 202 may include X coils (e.g., configured to generate the gradient field Gx), Y coils (e.g., configured to generate the gradient field Gy), and/or Z coils (e.g., configured to generate the gradient field Gz) (not shown in FIG. 2). In some embodiments, the Z coils may be designed based on circular (Maxwell) coils, while the X coils and the Y coils may be designed on the basis of the saddle (Golay) coil configuration. The three sets of coils may generate three different magnetic fields that are used for position encoding. The gradient coils 202 may allow spatial encoding of MR signals for image construction. The gradient coils 202 may be connected with one or more of an X gradient amplifier 204, a Y gradient amplifier 205, or a Z gradient amplifier 206. One or more of the three amplifiers may be connected to a waveform generator 216. The waveform generator 216 may generate gradient waveforms that are applied to the X gradient amplifier 204, the Y gradient amplifier 205, and/or the Z gradient amplifier 206. An amplifier may amplify a waveform. An amplified waveform may be applied to one of the coils in the gradient coils 202 to generate a magnetic field in the X-axis, the Y-axis, or the Z-axis, respectively. The gradient coils 202 may be designed for either a close-bore MR scanner or an open-bore MR scanner. In some instances, all three sets of coils of the gradient coils 202 may be energized and three gradient fields may be generated thereby. In some embodiments of the present disclosure, the X coils and Y coils may be energized to generate the gradient fields in the X direction and the Y direction.

In some embodiments, radio frequency (RF) coils 203 may be located inside the main magnet 201 and serve as transmitters, receivers, or both. The RF coils 203 may be in connection with RF electronics 209 that may be configured or used as one or more integrated circuits (ICs) functioning as a waveform transmitter and/or a waveform receiver. The RF electronics 209 may be connected to a radiofrequency power amplifier (RFPA) 207 and an analog-to-digital converter (ADC) 208.

When used as transmitters, the RF coils 203 may generate an RF signal that is utilized to generate MR signals related to the region of the object being imaged. The waveform generator 216 may generate an RF pulse. The RF pulse may be amplified by the RFPA 207, processed by the RF electronics 209, and applied to the RF coils 203 to generate the RF signal in response to a powerful current generated by the RF electronics 209 based on the amplified RF pulse.

When used as receivers, the RF coils may be responsible for detecting MR signals (e.g., echoes). After excitation, the MR signals generated by the object may be sensed by the RF coils 203. The receive amplifier then may receive the sensed MR signals from the RF coils 203, amplify the sensed MR signals, and provide the amplified MR signals to the ADC 208. The ADC 208 may transform the MR signals from analog signals to digital signals. The digital MR signals then may be sent to the processing device 120 for sampling.

In some embodiments, the gradient coils 202 and the RF coils 203 may circumferentially positioned with respect to the object. It is understood by those skilled in the art that the main magnet 201, the gradient coils 202, and the RF coils 203 may be situated in a variety of configurations around the object.

In some embodiments, the RFPA 207 may amplify an RF pulse (e.g., the power of the RF pulse, the voltage of the RF pulse) such that an amplified RF pulse is generated to drive the RF-coils 203. The RFPA 207 may include a transistor-based RFPA, a vacuum tube-based RFPA, or the like, or any combination thereof. The transistor-based RFPA may include one or more transistors. The vacuum tube-based RFPA may include a triode, a tetrode, a klystron, or the like, or any combination thereof. In some embodiments, the RFPA 207 may include a linear RFPA, or a nonlinear RFPA. In some embodiments, the RFPA 207 may include one or more RFPAs.

In some embodiments, the MR scanner 110 may further include an object positioning system (not shown). The object positioning system may include an object cradle and a transport device. The object may be placed on the object cradle and be positioned by the transport device within the bore of the main magnet 201.

It should be noted that the above description of the MRI system is merely provided for the purposes of illustration, and not intended to limit the scope of the present disclosure. For persons having ordinary skills in the art, multiple variations and modifications may be made under the teaching of the present invention. However, those variations and modifications do not depart from the scope of the present disclosure.

Figure 3A:
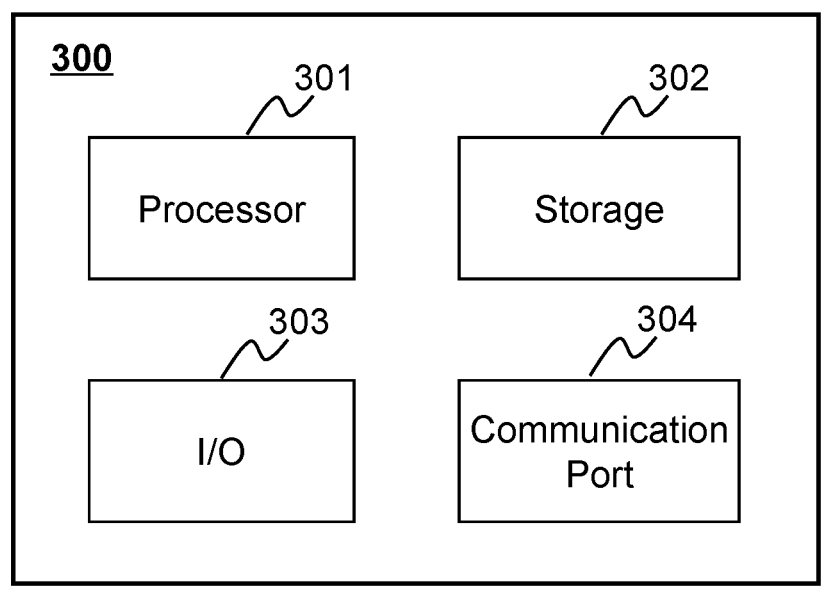
FIG. 3A is a schematic diagram illustrating hardware and/or software components of an exemplary computing device on which the processing device 120 may be implemented according to some embodiments of the present disclosure.

FIG. 3A is a schematic diagram illustrating hardware and/or software components of an exemplary computing device 300 on which the processing device 120 may be implemented according to some embodiments of the present disclosure. As illustrated in FIG. 3A, the computing device 300 may include a processor 301, a storage 302, an input/output (I/O) 303, and a communication port 304.

The processor 301 may execute computer instructions (program code) and perform functions of the processing device 120 in accordance with techniques described herein. The computer instructions may include, for example, routines, programs, objects, components, signals, data structures, procedures, modules, and functions, which perform particular functions described herein. For example, the processor 301 may process data obtained from the MR scanner 110, the terminal(s) 140, the storage device 130, and/or any other component of the imaging system 100. Specifically, the processor 301 may process one or more measured data sets obtained from the MR scanner 110. For example, the processor 301 may reconstruct an image based on the data set(s). In some embodiments, the reconstructed image may be stored in the storage device 130, the storage 302, etc. In some embodiments, the reconstructed image may be displayed on a display device by the I/O 303. In some embodiments, the processor 301 may perform instructions obtained from the terminal(s) 140. In some embodiments, the processor 301 may include one or more hardware processors, such as a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combinations thereof.

Merely for illustration, only one processor is described in the computing device 300. However, it should be noted that the computing device 300 in the present disclosure may also include multiple processors. Thus operations and/or method steps that are performed by one processor as described in the present disclosure may also be jointly or separately performed by the multiple processors. For example, if in the present disclosure the processor of the computing device 300 executes both operation A and operation B, it should be understood that operation A and operation B may also be performed by two or more different processors jointly or separately in the computing device 300 (e.g., a first processor executes operation A and a second processor executes operation B, or the first and second processors jointly execute operations A and B).

The storage 302 may store data/information obtained from the MR scanner 110, the terminal(s) 140, the storage device 130, or any other component of the imaging system 100. In some embodiments, the storage 302 may include a mass storage device, a removable storage device, a volatile read-and-write memory, a read-only memory (ROM), or the like, or any combination thereof. For example, the mass storage may include a magnetic disk, an optical disk, a solid-state drive, etc. The removable storage may include a flash drive, a floppy disk, an optical disk, a memory card, a zip disk, a magnetic tape, etc. The volatile read-and-write memory may include a random access memory (RAM). The RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. The ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage 302 may store one or more programs and/or instructions to perform exemplary methods described in the present disclosure. For example, the storage 302 may store a program for the processing device 120 for reconstructing MR images.

The I/O 303 may input or output signals, data, and/or information. In some embodiments, the I/O 303 may enable user interaction with the processing device 120. In some embodiments, the I/O 303 may include an input device and an output device. Exemplary input devices may include a keyboard, a mouse, a touch screen, a microphone, or the like, or a combination thereof. Exemplary output devices may include a display device, a loudspeaker, a printer, a projector, or the like, or a combination thereof. Exemplary display devices may include a liquid crystal display (LCD), a light-emitting diode (LED)-based display, a flat panel display, a curved screen, a television device, a cathode ray tube (CRT), or the like, or a combination thereof.

The communication port 304 may be connected with a network (e.g., the network 150) to facilitate data communications. The communication port 304 may establish connections between the processing device 120 and the MR scanner 110, the terminals) 140, or the storage device 130. The connection may be a wired connection, a wireless connection, or a combination of both that enables data transmission and reception. The wired connection may include an electrical cable, an optical cable, a telephone wire, or the like, or any combination thereof. The wireless connection may include Bluetooth, Wi-Fi, WiMax, WLAN, ZigBee, mobile network (e.g., 3G, 4G, 5G, etc.), or the like, or a combination thereof. In some embodiments, the communication port 304 may be a standardized communication port, such as RS232, RS485, etc. In some embodiments, the communication port 304 may be a specially designed communication port. For example, the communication port 304 may be designed in accordance with the digital imaging and communications in medicine (DICOM) protocol.

Figure 3B:
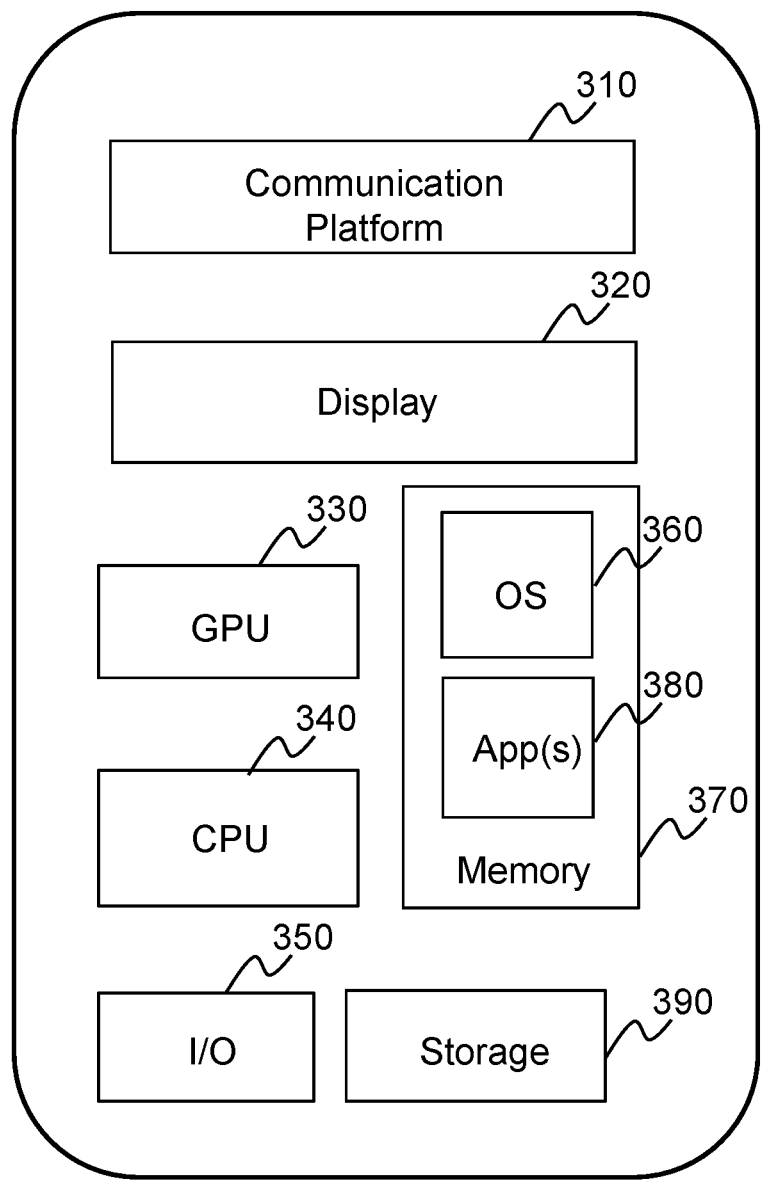
FIG. 3B is a schematic diagram illustrating hardware and/or software components of an exemplary mobile device according to some embodiments of the present disclosure.

FIG. 3B is a schematic diagram illustrating hardware and/or software components of an exemplary mobile device 300' according to some embodiments of the present disclosure. As illustrated in FIG. 3B, the mobile device 300' may include a communication platform 310, a display 320, a graphics processing unit (GPU) 330, a central processing unit (CPU) 340, an I/O 350, a memory 360, and a storage 390. In some embodiments, any other suitable component, including but not limited to a system bus or a controller (not shown), may also be included in the mobile device 300'. In some embodiments, a mobile operating system 370 (e.g., iOS, Android, Windows Phone, etc.) and one or more applications 380 may be loaded into the memory 360 from the storage 390 in order to be executed by the CPU 340. The applications 380 may include a browser or any other suitable mobile apps for receiving and rendering information relating to image processing or other information from the processing device 120. User interactions with the information stream may be achieved via the I/O 350 and provided to the processing device 120 and/or other components of the imaging system 100 via the network 120.

To implement various modules, units, and their functionalities described in the present disclosure, computer hardware platforms may be used as the hardware platform(s) for one or more of the elements described herein. The hardware elements, operating systems and programming languages of such computers are conventional in nature, and it is presumed that those skilled in the art are adequately familiar therewith to adapt those technologies to generate an image as described herein. A computer with user interface elements may be used to implement a personal computer (PC) or another type of work station or terminal device, although a computer may also act as a server if appropriately programmed. It is believed that those skilled in the art are familiar with the structure, programming and general operation of such computer equipment and as a result, the drawings should be self-explanatory.

Figure 4:
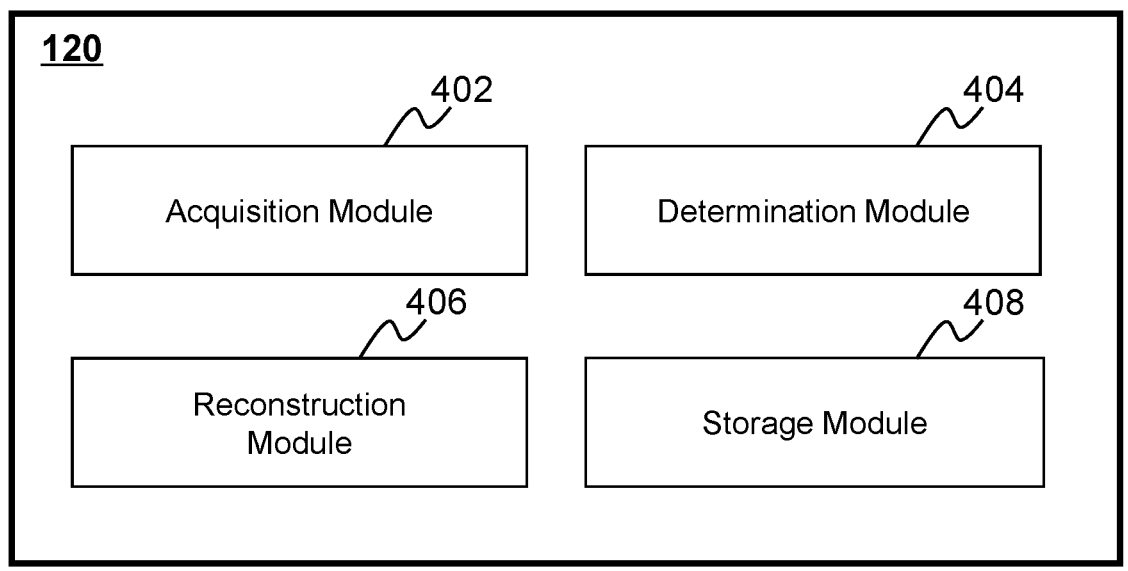
FIG. 4 is a block diagram illustrating an exemplary processing device according to some embodiments of the present disclosure.

FIG. 4 is a block diagram illustrating an exemplary processing device 120 according to some embodiments of the present disclosure. In some embodiments, the processing device 120 may be implemented on a computing device as illustrated in FIG. 2 or a mobile device as illustrated in FIG. 3. As illustrated in FIG. 4, the processing device 120 may include an acquisition module 402, a determination module 404, a reconstruction module 406, and a storage module 408. In some embodiments, the modules may be connected with each other via a wired connection (e.g., a metal cable, an optical cable, a hybrid cable, or the like, or any combination thereof) or a wireless connection (e.g., a Local Area Network (LAN), a Wide Area Network (WAN), a Bluetooth, a ZigBee, a Near Field Communication (NFC), or the like, or a combination thereof).

The acquisition module 402 may be configured to acquire first k-space data. In some embodiments, the first k-space data may be generated by entering acquired MR data into a plurality of first k-space locations. The acquisition module 402 may also acquire a set of reference k-space data. In some embodiments, the reference k-space data may be the k-space data from which a high quality image may be reconstructed.

The determination module 404 may be configured to determine an optimized k-space data adjustment technique. Based on the optimized k-space data adjustment technique, the determination module 404 may synthesize second k-space data for a plurality of second k-space locations. The determination module 404 may also generate a set of undersampled k-space data based on a set of reference k-space data. The determination module 404 may further adjust the set of undersampled k-space data according to one or more k-space data adjustment techniques to obtain a set of adjusted k-space data.

The reconstruction module 406 may be configured to reconstruct an image from the first k-space data and the second k-space data by an application of a reconstruction algorithm. In some embodiments, the first k-space data and the second k-space data may be jointly combined to form an adjusted k-space data that is used for image reconstruction.

The storage module 408 may be configured to store information. The information may include programs, software, algorithms, data, text, number, images and/or some other information. For example, the information may include data which may be used for reconstructing an MR image. As another example, the information may include an image reconstruction algorithm for reconstructing an MR image.

It should be noted that the above description of the processing device 120 is merely provided for the purposes of illustration, and not intended to limit the scope of the present disclosure. For persons having ordinary skills in the art, multiple variations and modifications may be made under the teachings of the present disclosure. For instance, the assembly and/or function of the processing device 120 may be varied or changed according to specific implementation scenarios. Merely by way of example, the acquisition module 402 and the determination module 404 may be integrated into a single module. As another example, some other components/modules may be added into the processing device 120. Such variations and modifications do not depart from the scope of the present disclosure.

Figure 5:
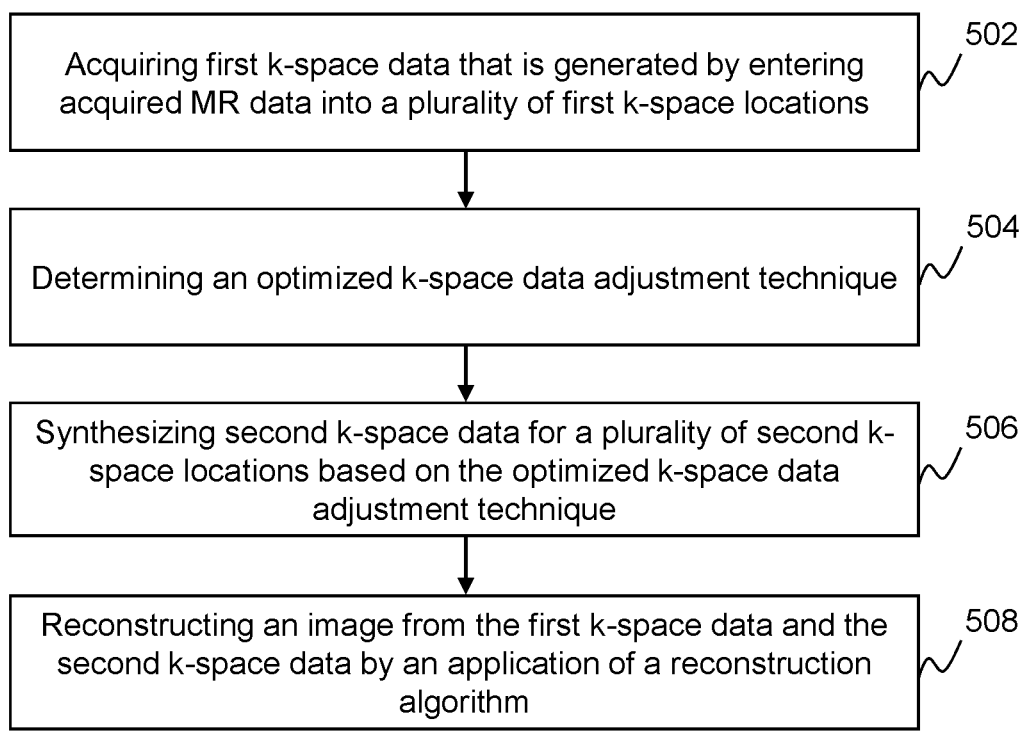
FIG. 5 is a flowchart illustrating an exemplary process for reconstructing an MR image according to some embodiments of the present disclosure.

FIG. 5 is a flowchart illustrating an exemplary process 500 for reconstructing an MR image according to some embodiments of the present disclosure. In some embodiments, one or more operations of the process 500 illustrated in FIG. 5 may be implemented in the imaging system 100 illustrated in FIG. 1. For example, process 500 illustrated in FIG. 5 may be stored in the storage device 130 in the form of instructions, and invoked and/or executed by the processing device 120 (e.g., the processor 210 of the computing device 200 as illustrated in FIG. 2, the GPU 330 or CPU 340 of the mobile device 300 as illustrated in FIG. 3).

In 502, first k-space data may be acquired. The first k-space data may be acquired by the processing device 120 (e.g., the acquisition module 402). In some embodiments, the first k-space data may be generated by entering acquired MR data into a plurality of first k-space locations. The acquired MR data may be collected by an MR scanner (e.g., the MR scanner 110) during a scanning process. During the scanning process, the MR scanner may regularly or irregularly vary a magnetic field (e.g., the magnetic field for frequency encoding, the magnetic field for phase encoding) to generate MR signals corresponding to the acquired MR data.

The plurality of first k-space locations may be referred to as sampling points in the k-space that are determined by a sampling pattern of the k-space. In some embodiments, a sampling pattern of the k-space may include one or more sampling trajectories along which the plurality of first k-space locations may be located. The one or more sampling trajectories may be formed according to a sampling technique. Exemplary sampling techniques may include a Cartesian sampling technique, a spiral sampling technique, a radial sampling technique, a Zig-Zag sampling technique, etc. For example, for the Cartesian sampling technique, the k-space sampling pattern may include multiple arrays of sampling points sampled along one or more Cartesian sampling trajectories. For the radial sampling technique, the k-space sampling pattern may include a plurality of sampling lines with different directions and intersecting at the center of the k-space.

In some embodiments, the k-space sampling pattern corresponding to the first k-space data may be a fully-sampling pattern, an undersampling pattern, or the like, or any combination thereof. As used herein, a fully-sampling pattern may denote that the sampling density in the k-space satisfy the Nyquist sampling theorem with respect to a predefined field view (FOV) and/or a predefined spatial resolution. An undersampling pattern may denote that the sampling density in the k-space do not satisfy the Nyquist sampling theorem with respect to the predefined field view (FOV) and/or the predefined spatial resolution. In some embodiments, the undersampling pattern may include a first region (e.g., a center region) in the k-space that is fully sampled and a second region (e.g., a peripheral region) in the k-space that is undersampled. Alternatively or additionally, the undersampling pattern may include a first direction along which the sampling is fully sampled and a second direction along which the sampling is undersampled.

Figure 8A:
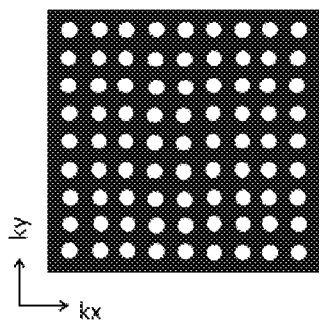
FIGS. 8A to 8C are schematic diagrams illustrating exemplary k-space sampling patterns obtained by using the Cartesian sampling technique according to some embodiments of the present disclosure.
Figure 8B:
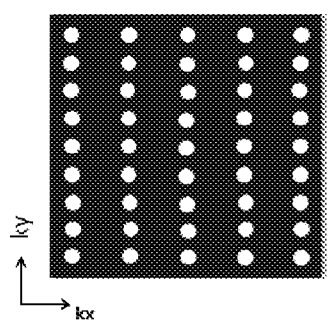
Figure 8C:
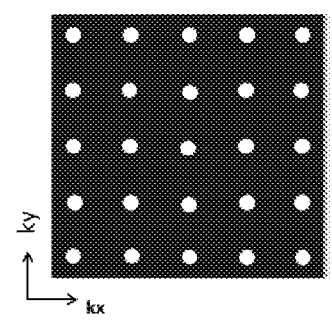

For better understanding, different k-space sampling patterns are illustrated in FIGS. 8A-8C and 9A-9C. FIGS. 8A-8C are three k-space sampling patterns obtained by using the Cartesian sampling technique. As shown in FIG. 8A, the k-space sampling pattern is a fully-sampling pattern in both of the $k_x$ direction (e.g., the phase encoding direction) and the $k_y$ direction (e.g. the frequency encoding direction), which means that the sampling densities of the k-space sampling pattern in both of the $k_x$ direction and the $k_y$ direction satisfy the Nyquist sampling theorem. The sampling density of the k-space sampling pattern in a specific direction may be defined as the number of sampling points per unit distance along the specific direction. As shown in FIG. 8B, the k-space sampling pattern is an undersampling pattern. In the $k_y$ direction (e.g. the frequency encoding direction), the sampling density of the k-space sampling pattern may satisfy the Nyquist sampling theorem. In the $k_x$ direction (e.g. the phase encoding direction), the sampling density of the k-space sampling pattern may not satisfy the Nyquist sampling theorem. As a result, the whole k-space in FIG. 8B may be undersampled. As shown in FIG. 8C, the k-space sampling pattern is an undersampling pattern. In both of the $k_x$ direction (e.g. the phase encoding direction) and the $k_y$ direction (e.g. the frequency encoding direction), the sampling densities of the k-space sampling pattern may not satisfy the Nyquist sampling theorem.

Figure 9A:
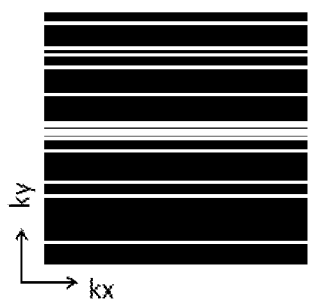
FIGS. 9A to 9C are schematic diagrams illustrating exemplary k-space sampling patterns according to some embodiments of the present disclosure.
Figure 9B:
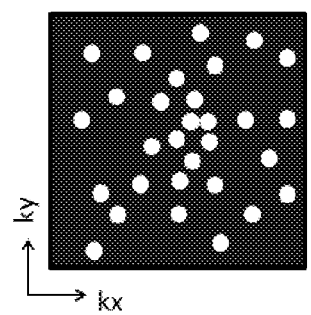
Figure 9C:
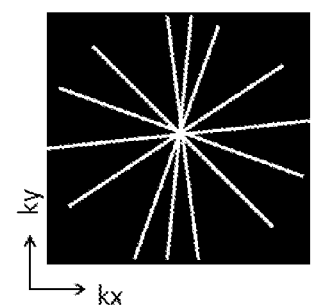

In some embodiments, the k-space sampling pattern may include a random sampling pattern. As shown in FIG. 9A, the k-space sampling pattern may be obtained by using the Cartesian sampling technique. In the $k_x$ direction (e.g., the frequency encoding direction), the k-space sampling is regular and fully sampled. In the $k_y$ direction (e.g. the phase encoding direction), the k-space sampling is randomly undersampled. As shown in FIG. 9B, the k-space sampling pattern is also obtained by using the Cartesian sampling technique. Compared with FIG. 9A, in both of the $k_x$ direction (e.g. the frequency encoding direction) and the $k_y$ direction (e.g. the phase encoding direction), the k-space sampling are randomly undersampled such that the sampling points are randomly distributed in the k-space. As shown in FIG. 9C, the k-space sampling pattern is obtained by using the radial sampling technique. The k-space sampling pattern includes a plurality of radial sampling lines corresponding to different angles. In the radial direction (e.g., along each sampling line), the k-space sampling is fully sampled. In the circumferential direction, the k-space sampling is randomly undersampled.

Referring back to FIG. 6, in some embodiments, the first k-space data may be processed by a pre-processing operation in order to facilitate the processing of the first k-space data in subsequent operations (e.g., the generation of the second k-space data, the reconstruction operation). In some embodiments, the pre-processing operation may include a de-noising operation, an enhancement operation, a smoothing operation, a fusion operation, a segmentation operation, a registration operation, a transformation operation, or the like, or a combination thereof. Specifically, the smoothing operation may be performed based on a Gaussian filter, an average filter, a median filter, a wavelet transformation, or the like, or a combination thereof. The enhancement operation may include a histogram equalization, an image sharpening, a Fourier transform, a high-pass filtering, a low-pass filtering, or the like, or a combination thereof. The de-noising operation may include applying a spatial-domain filter, a transform-domain filter, a morphological noise filter, or the like, or a combination thereof. The segmentation operation may be performed based on a segmentation algorithm. Exemplary segmentation algorithms may include a threshold-based segmentation algorithm, an edge-based segmentation algorithm, a region-based segmentation algorithm, or the like, or a combination thereof. The fusion operation may be performed using, for example, an optimal seam-line algorithm, a gradient pyramid algorithm, etc. The registration operation may be performed using, for example, a cross-correlation algorithm, a Walsh transform algorithm, a phase correlation algorithm, etc. The transformation operation may include an image geometric transformation, an image perspective transformation, an image affine transformation, etc.

In 504, an optimized k-space data adjustment technique may be determined. The optimized k-space data adjustment technique may be determined by the processing device 120 (e.g., the determination module 404). In some embodiments, the optimized k-space data adjustment technique may be used to adjust the one or more sampling trajectories of the k-space sampling pattern. In some embodiments, the adjustment of the one or more sampling trajectories may include an operation of adding more sampling points in the k-space, an operation of changing a sampling pattern of the k-space, or the like, or a combination thereof. The optimized k-space data adjustment technique may include a partial Fourier imaging technique, a parallel imaging technique, a regridding technique, or the like, or any combination thereof.

In some embodiments, the partial Fourier imaging technique may utilize the conjugate symmetry of k-space to synthesize part of the k-space data that are unacquired in the scanning process. Exemplary partial Fourier imaging techniques may include a zero-padding imaging reconstruction technique, a conjugate symmetry imaging reconstruction technique, a homodyne imaging reconstruction technique, a projection onto convex sets (PACS) imaging reconstruction technique, or the like, or any combination thereof.

In some embodiments, the parallel imaging technique may utilize the placement and sensitivities of RF receiver coils to assist the adjustment of the one or more sampling trajectories of the k-space sampling pattern. Exemplary parallel imaging technique may include parallel imaging with localized sensitivities (PILS) reconstruction technique, a sensitivity encoding (SENSE) imaging reconstruction technique, a simultaneous acquisition of spatial harmonics (SMASH) imaging reconstruction technique, a generalized autocalibrating partial parallel acquisition (GRAPPA) technique, an iterative self-consistent parallel imaging reconstruction (SPIRIT) technique, or the like, or any combination thereof.

In some embodiments, the regridding imaging technique may be used to transfer one k-space sampling pattern (e.g., a radial sampling trajectory) to another k-space sampling pattern (e.g., a Cartesian sampling trajectory). Exemplary regridding imaging technique may include a Voronoi cell area algorithm, a Jacobian algorithm, a Jackson's area density algorithm, an iterative algorithm, a matrix inverses algorithm, or the like, or any combination thereof.

Figure 6:
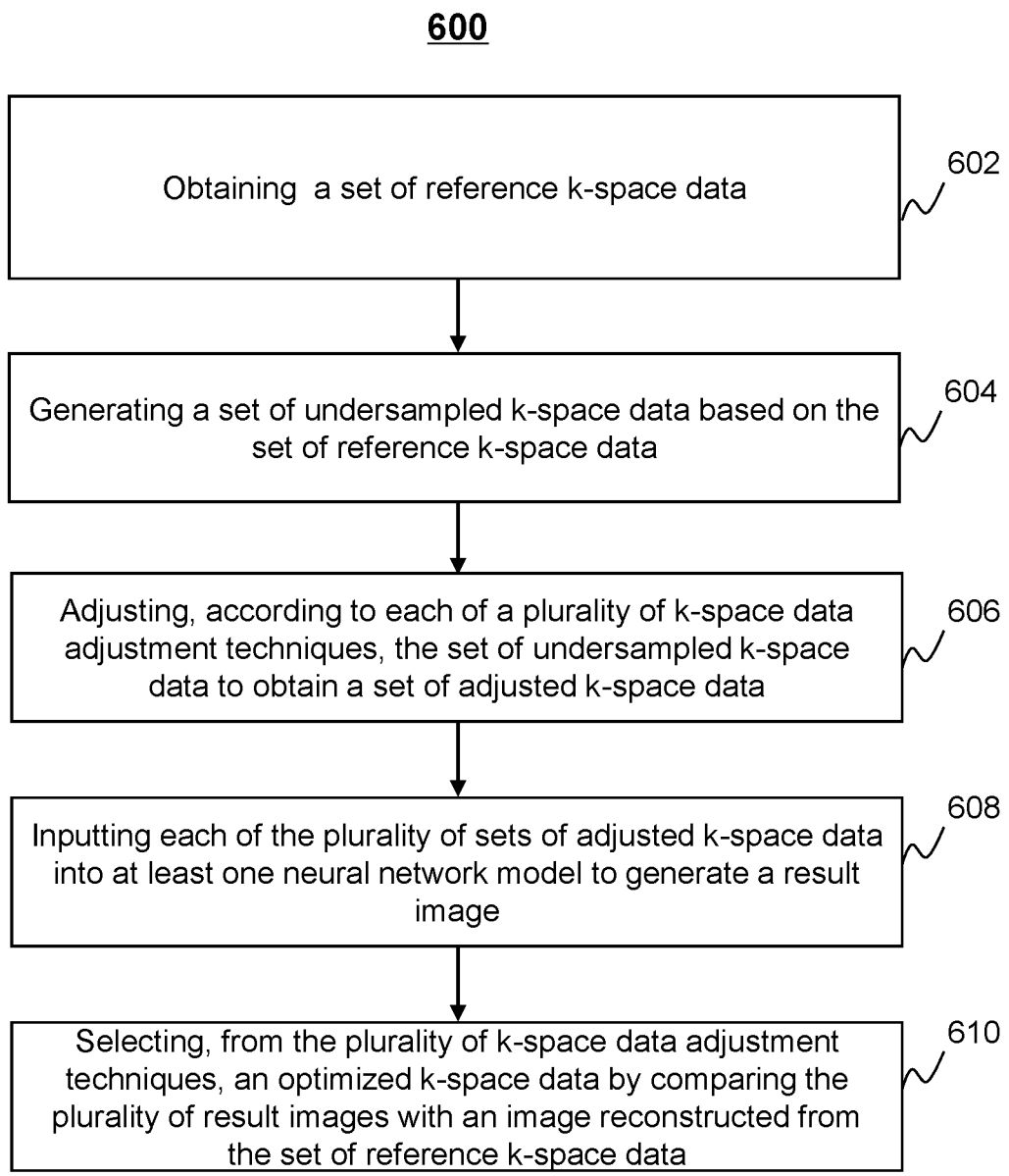
FIG. 6 is a flowchart illustrating an exemplary process for determining the optimized k-space data adjustment technique according to some embodiments of the present disclosure.

More descriptions about the determination of an optimized k-space data adjustment technique may be found elsewhere in the present disclosure, e.g., FIG. 6 and the descriptions thereof.

In 506, second k-space data for a plurality of second k-space locations may be synthesized based on the optimized k-space data adjustment technique. The second k-space data may be synthesized by the processing device 120 (e.g., the determination module 404). The plurality of second k-space locations may correspond to unacquired MR data (also referred to as "missing MR data") in the scanning process. In some embodiments, the plurality of second k-space locations may be the locations that are not filled with the acquired MR data. That is, the plurality of second k-space locations may have no overlap with the plurality of first k-space locations. Alternatively, the plurality of second k-space locations may have partial overlap with the plurality of first k-space locations.

Figure 10A:
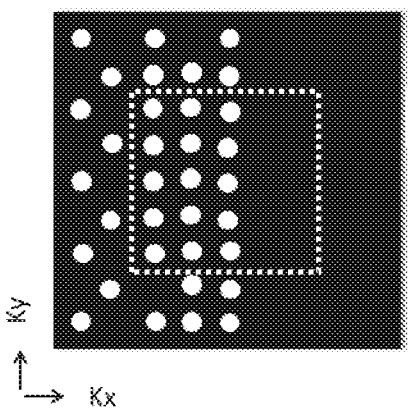
FIGS. 10A(a) to 10A(b), 10B(a) to 10B(b), and 10C(a) to 10C(b) are schematic diagrams illustrating examples of adjusting k-space data according to some embodiments of the present disclosure.
Figure 10A:
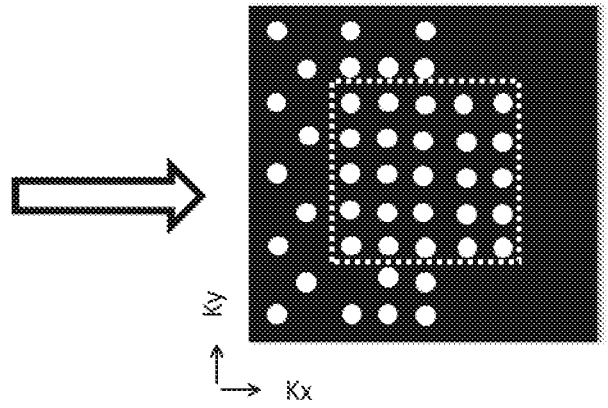

In some embodiments, the second k-space data for the plurality of second k-space locations may be added in the k-space based on the optimized k-space data adjustment technique. For example, in the k-space sampling pattern in FIG. 10A(a), the center region (i.e., the left portion inside the dotted box) has a higher sampling density than that of the outer region (i.e., the left region of the k-space outside the dotted box). In the outer region, the k-space sampling is randomly undersampled. In the left portion inside the dotted box, the k-space sampling is fully sampled. In this case, the processing device 120 (e.g., the determination module 404) may use the optimized k-space data adjustment technique (e.g., the half Fourier imaging technique) to obtain an adjusted k-space sampling pattern as shown in FIG. 10A(b). By this optimized k-space data adjustment technique, the right portion inside the dotted box is filled with additional sampling points such that the center region of the k-space is fully sampled, and the information included in the center region of the adjusted k-space sampling pattern are enriched relative to the sampling pattern in FIG. 10A(a).

Figure 10B:
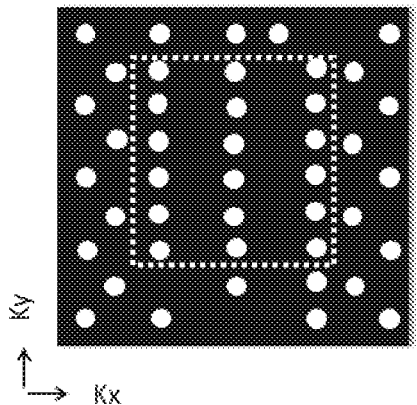
Figure 10B:
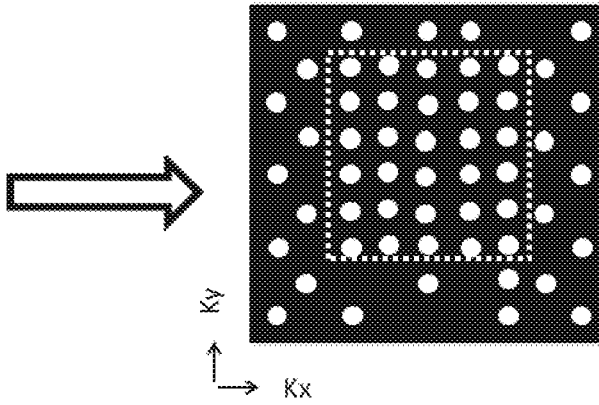

As another example, in the k-space sampling pattern in FIG. 10B(a), the center region (i.e., the region inside the dotted box) is undersampled and has a relatively low sampling density. The outer region (i.e., the region outside the dotted box) is randomly undersampled. In this case, the processing device 120 (e.g., the determination module 404) may use the optimized k-space data adjustment technique (e.g., the parallel imaging technique) to obtain an adjusted k-space sampling pattern as shown in FIG. 10B(b). By this optimized k-space data adjustment technique, the center region of the k-space is filled with more sampling points, causing an increase of the sample density therein.

Figure 10C:
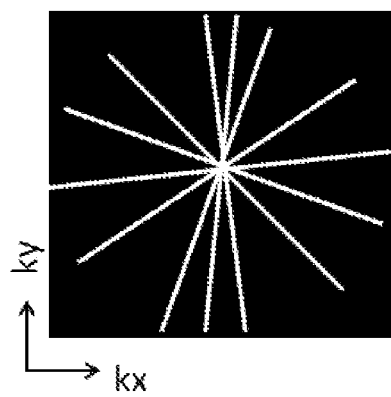
Figure 10C:
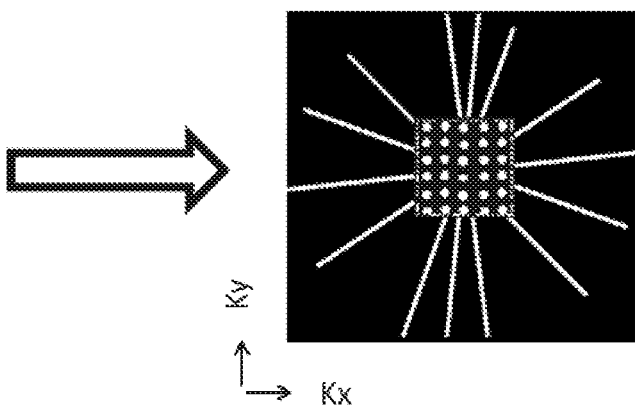

As still another example, FIG. 10C(a) shows a random radial sampling pattern in k-space. The radial random sampling pattern includes a plurality of sampling lines randomly and radially distributed in the k-space. The sampling lines have different directions and intersect at the center of the k-space. The processing device 120 (e.g., the determination module 404) may use the optimized k-space data adjustment technique (e.g., the regridding technique) to obtain an adjusted k-space sampling pattern as shown in FIG. 10C(b). The center region (i.e., the region inside the dotted box) of the k-space is transferred to multiple arrays of sampling points, which is similar to the sampling points generated by the Cartesian sampling technique.

In 508, an image may be reconstructed from the first k-space data and the second k-space data by an application of a reconstruction algorithm. The image may be reconstructed by the processing device 120 (e.g., the reconstruction module 406). In some embodiments, the first k-space data and the second k-space data may be jointly combined to form an adjusted k-space data that is used for image reconstruction. Optionally, a portion of the adjusted k-space data that corresponds to a center portion of the k-space may be fully sampled. In some embodiments, the reconstruction algorithm may be based at least in part on a neural network technique and/or a non-neural network technique. Exemplary neural network techniques may be performed by one or more models including a back-propagation (BP) neural network model, an artificial neural network (ANN), a convolutional neural network (CNN) model, a deep neural network (DNN) model, a generative adversarial network (GAN), a radial basis function (RBF) neural network model, a deep belief nets (DBN) neural network model, an Elman neural network model, or the like, or any combination thereof. More descriptions about a neural network model, as well as its training process, may be found elsewhere in the present disclosure, e.g., FIG. 7 and the descriptions thereof. Exemplary non-neural network technique may include a 2-dimensional Fourier transform technique, a back-projection technique (e.g., a convolution back projection technique, a filtered back projection technique), an iteration technique, a parallel imaging technique, a compressed sensing technique, etc.

In some embodiments, the reconstruction algorithm may be achieved via a specific neural network technique described above. For example, the adjusted k-space sampling pattern, including the first k-space data and the second k-space data, may be used as the input of the specific neural network technique, and the image may be reconstructed as an output of the specific neural network technique. In some embodiments, the reconstruction algorithm may be achieved via a combination of a neural network technique and a non-neural network technique. The non-neural network technique may be applied prior to or after the application of the neural network technique. For example, the neural network technique may receive the adjusted k-space sampling pattern, including the first k-space data and the second k-space data, as its input and generate an image as its output. The output of the neural network technique may be processed (e.g., converted to k-space data) and further used as the input of the non-neural network technique. The non-neural network technique may reconstruct an image as the final result of the reconstruction algorithm. Alternatively or additionally, the neural network technique and the non-neural network technique may be successively used in an iterative manner. During the iterations, the output of the neural network technique (or the processed result thereof) may be used as the input of the non-neural network technique, and the output of the non-neural network technique (or the processed result thereof) may be used as the input of the neural network technique, until a convergence is reached. In some embodiments, the convergence may be reached when a similarity degree between last two reconstructed images is above a threshold. It shall be noted that the above description of the combination of a neural network technique and a non-neural network is merely provided for illustration purpose, a person having ordinary skills in the art shall be able to achieve the combination of more than one neural network technique and more than one non-neural network technique in a similar way.

In some embodiments, the generation of the second k-space data may compensate the missing information due to the unacquired MR data during the scanning. The combination of the first k-space data and the second k-space data for the image reconstruction may help remove aliasing artifacts due to under-sampling of k-space, suppress artifacts due to motion or attenuation of the T2 and T2* relaxations, and/or reduce noises of MR images to obtain a high quality image (e.g., an image with a high signal-to-noise ratio (SNR), an image with high tissue contrast). Furthermore, using the reconstruction algorithm, which is based at least in part on a neural network technique, to reconstruct the MR image may improve the efficiency of the image reconstruction.

It should be noted that the above description of the process magnetic resonance imaging is merely provided for the purposes of illustration, and not intended to limit the scope of the present disclosure. For persons having ordinary skills in the art, multiple variations and modifications may be made under the teachings of the present disclosure. For example, operation 504 and operation 506 may be performed simultaneously. As another example, the process 500 may further include storing the first k-space data and second k-space data. As still a further example, instead of reconstructing an image in the image domain, the reconstruction algorithm described above may perform the similar function as the optimized k-space data adjustment technique to reconstruct k-space data. The reconstructed k-space data may be further used to generate the image in the image domain. Such variations and modifications do not depart from the scope of the present disclosure.

FIG. 6 is a flowchart illustrating an exemplary process 600 of determining the optimized k-space data according to some embodiments of the present disclosure. In some embodiments, one or more operations of the process 600 illustrated in FIG. 6 may be implemented in the imaging system 100 illustrated in FIG. 1. For example, the process 600 illustrated in FIG. 6 may be stored in the storage device 130 in the form of instructions, and invoked and/or executed by the processing device 120 (e.g., the processor 210 of the computing device 200 as illustrated in FIG. 2, the GPU 330 or CPU 340 of the mobile device 300 as illustrated in FIG. 3).

In 602, a set of reference k-space data may be obtained. The set of reference k-space data may be obtained by the processing device 120 (e.g., the acquisition module 402).

In some embodiments, the reference k-space data may be the k-space data from which a high quality image may be reconstructed. As used herein, a high quality image may represent an image with a relatively high signal-to-noise ratio (SNR), an image with a relatively high spatial resolution, an image with relatively small artifacts, an image with relatively high contrast, or the like, or a combination thereof. The image with a relatively high SNR may refer to an image whose SNR is above an SNR threshold. The image with a relatively high spatial resolution may refer to an image whose spatial resolution is above a spatial resolution threshold. The image with relatively small artifacts may refer to an image in which the area of artifacts is below an area threshold. The image with a relatively high contrast may refer to an image whose contrast is above a contrast threshold. The various thresholds described above may be default values of the imaging system 100, or may be manually set by a user according to an actual need.

In some embodiments, the reference k-space data may be the k-space data that is fully sampled. For example, the sampling densities of the reference k-space data along one or more directions (e.g., the $k_x$ direction, the $k_y$ direction) satisfy the Nyquist sampling theorem.

In 604, a set of undersampled k-space data may be generated based on the set of reference k-space data. The set of undersampled k-space data may be generated by the processing device 120 (e.g., the determination module 404).

In some embodiments, the undersampled k-space data may be generated by deleting or removing a portion of the reference k-space data in a regular or irregular (e.g., random) manner. For example, assuming that the reference k-space data is filled in a plurality of k-space locations, the undersampled k-space data may be generated by deleting the data in nearly a half portion (e.g., the lower half portion) of the plurality of k-space locations. In this case, the undersampled k-space data may be the k-space data that is included in the reminder portion of the plurality of k-space locations. It shall be noted that, with different sampling techniques of the reference k-space data, the deletion or remove of the data may be achieved in different ways. For example, in the case that the reference k-space data is sampled along the radial sampling trajectory, the deletion of the data may be realized by removing one or more sampling lines passing through the center of the k-space.

In some embodiments, the undersampled k-space data generated from the reference k-space data may be similar to the undersampling sampling pattern(s) described elsewhere in the present disclosure (e.g., FIGS. 5, 8A-8C, 9A-9C, and the descriptions thereof).

In 606, the set of undersampled k-space data may be adjusted according to each of a plurality of k-space data adjustment techniques to obtain a set of adjusted k-space data. The set of undersampled k-space data may be adjusted by the processing device 120 (e.g., the determination module 404).

In some embodiments, a k-space data adjustment techniques may include a non-neural network technique, such as, a partial Fourier imaging technique, a parallel imaging technique, a regridding technique, or the like, or any combination thereof. In some embodiments, the k-space data adjustment technique may be a neural network technique (e.g., a deep learning model). The plurality of k-space data adjustment techniques may include two or more different k-space data adjustment techniques. As used herein, two identical k-space data adjustment techniques can be regarded as the same k-space data adjustment technique. If two k-space data adjustment techniques are of different types, or with at least one different parameter or parameter value, the two k-space data adjustment techniques may be regarded as different k-space data adjustment techniques. For example, the partial Fourier imaging technique and the parallel imaging technique are two different types of k-space data adjustment techniques and regarded as two different k-space data adjustment techniques. As another example, a first partial Fourier imaging technique with a first value of a certain parameter and a second partial Fourier imaging technique with a second value, different from the first value, of the certain parameter may be regarded as two different k-space data adjustment techniques. More descriptions of the k-space data adjustment techniques may be found elsewhere in the present disclosure (e.g., FIG. 5 and the descriptions thereof).

In some embodiments, the set of adjusted k-space data may be similar to one or more of the adjusted data described in FIGS. 10A(b), 10B(b), and 10C(b).

In 608, each of the plurality of sets of adjusted k-space data may be inputted into at least one neural network model. The adjusted k-space data may be inputted into the at least one neural network model by the processing device 120 (e.g., the determination module 404). As described above, each of the plurality of sets of adjusted k-space data may correspond to a k-space data adjustment technique. The at least one neural network model may include a trained neural network model for reconstructing the image based on each of the plurality of sets of the adjusted k-space data. Specifically, each of the plurality of sets of adjusted k-space data may be used as an input of the at least one neural network model, and the at least one neural network model may output a result image as the reconstructed image corresponding to each of the plurality of sets of adjusted k-space data.

In some embodiment, the at least one neural network model may be a uniform neural network model such that the plurality of sets of adjusted k-space data may be inputted into the uniform neural network model to generate corresponding result images, respectively. For example, two sets of adjusted k-space data (denoted as A1 and A2, respectively) may be generated by the processing device 120 (e.g., the determination module 404) according to two different k-space data adjustment techniques as described in operation 606. The two sets of adjusted k-space data A1 and A2 may be sequentially inputted into the uniform neural network model to obtain two result images (denoted as B1 and B2, respectively).

In some embodiment, the at least one neural network model may include at least two different neural network models. Each of the plurality of sets of adjusted k-space data may be inputted into one of the at least two different neural network models to generate a corresponding result image. For example, two sets of adjusted k-space data (denoted as A1' and A2', respectively) may be generated by the processing device 120 (e.g., the determination module 404) according to two different k-space data adjustment techniques as described in operation 606. The two sets of adjusted k-space data A1' and A2' may be inputted into two different neural network models, denoted as M1' and M2', to generate result images B1' and B2', respectively.

In some embodiments, the at least one neural network model may perform a reconstruction algorithm similar to or same as the reconstruction algorithm described in operation 508. For example, the at least one neural network model may operate based on a neural network technique such as, a back-propagation (BP) neural network model, an artificial neural network (ANN), a convolutional neural network (CNN) model, a deep neural network (DNN) model, a generative adversarial network (GAN), a radial basis function (RBF) neural network model, a deep belief nets (DBN) neural network model, an Elman neural network model, or the like, or any combination thereof. Alternatively or additionally, the at least one neural network model may work together with a non-neural network model to reconstruct the image(s) by a combination of a neural network technique and a non-neural network technique as described elsewhere in the present disclosure (e.g., the operation 508).

In 610, an optimized k-space data adjustment technique may be selected from the plurality of k-space data adjustment techniques. The optimized k-space data adjustment technique may be selected by the processing device 120 (e.g., the determination module 404). In some embodiments, the optimized k-space data adjustment technique may be determined by comparing the plurality of result images with an image reconstructed from the set of reference k-space data. The image reconstructed from the set of reference k-space data may be referred to as a reference image, and may be reconstructed according to one or more reconstruction algorithm (e.g., a non-neural network technique, a neural network technique) described elsewhere in the present disclosure. Specifically, the image may be reconstructed from the set of reference k-space data by performing an inverse Fourier transform on the set of reference k-space data. In some embodiments, the processing device 120 (e.g., the determination module 404) may determine a similarity between each of the plurality of result images and the reference image, and select the k-space data adjustment technique, whose corresponding result image is most similar to the reference image, as the optimized k-space data adjustment technique. In some embodiments, the similarity between two images may be indicated by an index such as, a mean absolute percent error (MAPE), a mean square error (MSE), a mean absolute error (MAE), a mean relative error (MRE), a root mean square error (RMSE), or the like.

Taking the MSE as an example, for each of the plurality of result images, the processing device 120 (e.g., the determination module 404) may determine an MSE value based on the pixel values of the each result image and the pixel values of the reference image. For example, the processing device 120 may calculate the pixel value difference between each pixel in a result image and its corresponding pixel in the reference image, and then calculate the MSE value based on all the pixel value differences. The result image that corresponds to the minimum MSE value may be regarded as most similar to the reference image, and its corresponding k-space data adjustment technique may be regarded as the optimized k-space data adjustment technique.

In some embodiments, the operation of determining the optimized k-space data as described above may improve the efficiency of image reconstruction in subsequent operations (e.g., a reconstruction operation similar to operation 508).

It should be noted that the above description of the process of allocating computing resources for medical applications in response to requests for performing the medical applications is merely provided for the purposes of illustration, and not intended to limit the scope of the present disclosure. For persons having ordinary skills in the art, multiple variations and modifications may be made under the teachings of the present disclosure. Such variations and modifications do not depart from the scope of the present disclosure. For example, operation 604 and operation 606 may be combined into a single operation to obtain the adjusted k-space data.

Figure 7:
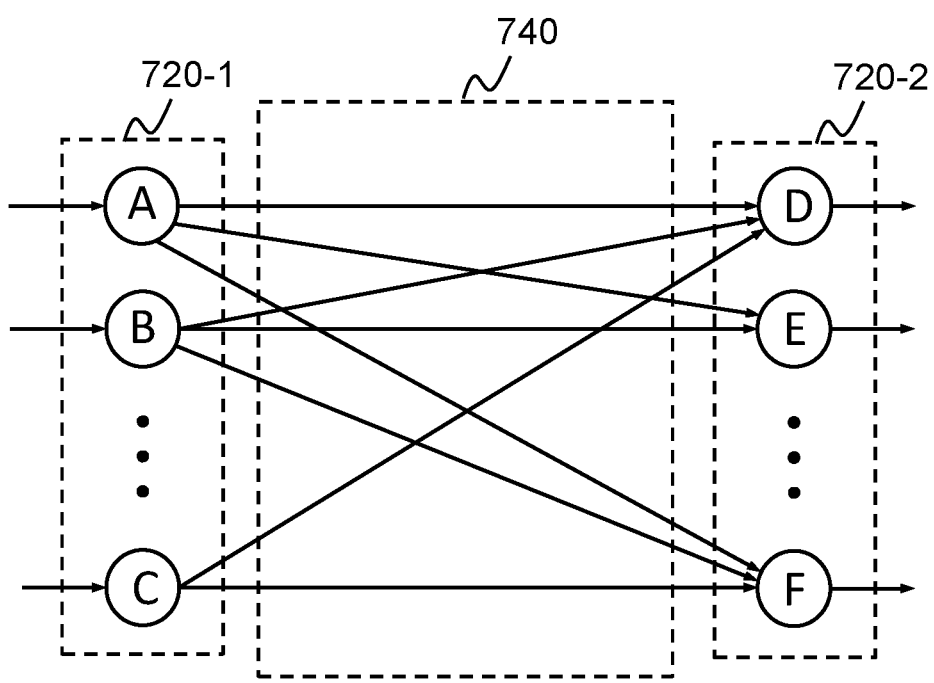
FIG. 7 is a schematic diagram illustrating an exemplary neural network model according to some embodiments of the present disclosure.

FIG. 7 is a schematic diagram illustrating an exemplary neural network model 700 according to some embodiments of the present disclosure.

A neural network model may include an input layer, one or more hidden layers, and an output layer. Each of the layers may include one or more nodes, also referred to as neurons. Neurons may be multi-input and single-output information processing unit with spatial integration and thresholding. The multiple hidden layers may include one or more convolutional layers, one or more Rectified Linear Units layers (ReLU layers), one or more pooling layers, one or more fully connected layers, or the like, or a combination thereof. As described in connection with the process 600, the processing device 120 (e.g., the determination module 404) may use the adjusted k-space data as an input of the neural network model. The adjusted k-space data may be denoted by vectors or matrixes including a plurality of elements. Each element in a vector or matrix may have a value representing a feature of the element. The values of the plurality of elements may be further transmitted to the hidden layers for processing.

For illustration purposes, as shown in FIG. 7, hidden layers of a neural network model is taken as an example. The hidden layers of the neural network model may include a convolutional layer 720-1 (also referred as a first level) and a pooling layer 720-2 (also referred as a second level). The convolutional layer 720-1 and the pooling layer 720-2 may be connected by a synapse network connection 740. The convolutional layer 720-1 may include a plurality of kernels (e.g., A, B, and C). The plurality of kernels may be used to extract the adjusted k-space data. In some embodiments, each of the plurality of kernels may filter a portion (e.g., a region) of the adjusted k-space data to produce a specific feature corresponding to the portion of the adjusted k-space data. The feature may include a low-level feature (e.g., an edge feature, a texture feature), a high-level feature, or a complicated feature (e.g., a deep hierarchical feature) that is calculated based on the kernel(s).

The pooling layer 720-2 may take the output of the convolutional layer 720-1 as an input. The pooling layer 720-2 may include a plurality of pooling nodes (e.g., D, E and F). The plurality of pooling nodes may be used to sample the output of the convolutional layer 720-1, and thus may reduce the computational load of data processing and increase the speed of data processing of the imaging system 100. In some embodiments, the determination module 404 may reduce the volume of the matrix corresponding to the adjusted k-space data in the pooling layer 720-2.

The synapse network 740 may include a plurality of synapses configured to connect the kernels included in the convolutional layer 720-1 with the pooling nodes included in the pooling layer 720-2. Each synapse may be configured with a weight, which may be randomly initialized to be a small number and updated during the training process.

In some embodiments, during a training process of one or more neural network models described elsewhere in the present disclosure (e.g., the neural network model described in connection with operation 508), a sample of adjusted k-space data may be taken as an input of the neural network model, and a result image may be outputted by the neural network model at its output layer. Then, a difference between the result image and a reference image may be calculated and sent back to each layer (e.g., the hidden layers) to update the weight using a backpropagation pass algorithm. In some embodiments, the sample of the adjusted k-space data may be generated from k-space data from which the reference image is reconstructed. The generation of the sample of the adjusted k-space data may include an undersampling of the k-space data, an adjustment to the undersampled k-space data, which may be similar to the operations 602 to 606. The reference image may be reconstructed from the k-space sample data according to one or more reconstruction algorithm described elsewhere in the present disclosure.

It should be noted that the neural network model described above may be modified when applied in different conditions. For example, in a training process, a Rectified Linear Units layer may be added. An activation function may be used by the Rectified Linear Units layer to constrain an output of the Rectified Linear Units layer. Exemplary activation functions may include a linear function, a ramp function, a threshold function, a Sigmoid function, etc.

In some embodiments, the determination module 404 may get access to multiple processing units, such as GPUs, in the imaging system 100. The multiple processing units may perform parallel processing in some layers of the neural network model. The parallel processing may be performed in such a manner that the calculations of different nodes in a layer of the neural network model may be assigned to two or more processing units. For example, one GPU may run the calculations corresponding to kernels A and B, and the other GPU(s) may run the calculations corresponding to kernels C and D in the convolutional layer 720-1. Similarly, the calculations corresponding to different nodes in another type of layers in the neural network model may be performed in parallel by the multiple GPUs.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A non-transitory computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C #, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities, properties, and so forth, used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

We claim:

1. A method implemented on at least one machine each of which includes at least one processor and at least one storage device, the method comprising:
    acquiring first k-space data that is generated by entering acquired magnetic resonance (MR) data into a plurality of first k-space locations;
    synthesizing, based on the first k-space data, second k-space data for a plurality of second k-space locations that are not filled with the acquired MR data; and
    reconstructing an image from the first k-space data and the second k-space data by applying a reconstruction algorithm, wherein the reconstruction algorithm is based at least in part on a neural network technique.

2. The method of claim 1, wherein the reconstruction algorithm is also based on a non-neural network technique that is applied prior to or after the application of the neural network technique.

3. The method of claim 2, wherein the non-neural network technique includes a parallel imaging technique or a compressed sensing technique.

4. The method of claim 1, wherein the second k-space data is synthesized according to one or more techniques including a partial Fourier imaging technique, a parallel imaging technique, or a regridding technique.

5. The method of claim 1, wherein synthesizing, based on the first k-space data, second k-space data for a plurality of second k-space locations that are not filled with the acquired MR data includes:
    determining, among a plurality of k-space data adjustment techniques, an optimized k-space data adjustment technique; and synthesizing the second k-space data based on the optimized k-space data adjustment technique.

6. The method of claim 5, wherein determining, among a plurality of k-space data adjustment techniques, an optimized k-space data adjustment technique includes:
  obtaining a set of reference k-space data;
  generating a set of undersampled k-space data based on the set of reference k-space data;
  adjusting, according to each of the plurality of k-space data adjustment techniques, the set of undersampled k-space data to obtain a set of adjusted k-space data; and
  selecting, from the plurality of k-space data adjustment techniques, the optimized k-space data adjustment technique based on the plurality of sets of adjusted k-space data.

7. The method of claim 6, wherein selecting, from the plurality of k-space data adjustment techniques, the optimized k-space data adjustment technique based on the plurality of sets of adjusted k-space data includes:
  inputting each of the plurality of sets of adjusted k-space data into at least one neural network model to generate a result image;
  generating a reference image based on the set of reference k-space data; and
  determining the optimized k-space data adjustment technique by comparing the plurality of result images with the reference image.

8. The method of claim 7; wherein the at least one neural network model includes at least two different neural network models, and inputting each of the plurality of sets of adjusted k-space data into at least one neural network model to generate a result image includes:
  inputting each of the plurality of sets of adjusted k-space data into one of the at least two different neural network models to generate its corresponding result image.

9. The method of claim 7, wherein the at least one neural network model includes an artificial neural network (ANN) model.

10. The method of claim 7, wherein determining the optimized k-space data adjustment technique by comparing the plurality of result images with the reference image includes:
  for each of the plurality of result images, generating a mean square error between pixels of the each result image and pixels of the reference image by comparing the each result image and the reference image; and
  determining, based on the mean square errors; the optimized k-space data adjustment technique.

11. The method of claim 1, wherein acquiring first k-space data that is generated by entering acquired MR data into a plurality of first k-space locations includes:
  sampling the plurality of first k-space locations of the first k-space data according to one or more trajectories including a Cartesian sampling trajectory, a spiral sampling trajectory, or a radial sampling trajectory.

12. The method of claim 1, wherein the first k-space data and the second k-space data jointly form a center portion of k-space that is fully sampled.

13. A method implemented on at least one machine each of which includes at least one processor and at least one storage device, the method comprising:
  obtaining a set of reference k-space data;
  generating a set of undersampled k-space data based on the set of reference k-space data;
  obtaining a plurality of k-space data adjustment techniques;
  adjusting, according to each of the plurality of k-space data adjustment techniques, the set of undersampled k-space data to obtain a set of adjusted k-space data; and
  selecting, from the plurality of k-space data adjustment techniques, an optimized k-space data adjustment technique based on the plurality of sets of adjusted k-space data.

14. The method of claim 13, wherein selecting, from the plurality of k-space data adjustment techniques, an optimized k-space data adjustment technique based on the plurality of sets of adjusted k-space data includes;
  reconstructing an image from each of the plurality of sets of adjusted k-space data by applying a reconstruction algorithm, the reconstruction algorithm being based at least in part on a neural network technique;
  generating a reference image based on the set of reference k-space data; and
  determining the optimized k-space data adjustment technique by comparing the plurality of images with the reference image.

15. The method of claim 14, wherein the neural network technique includes at least two different neural network models, and reconstructing an image from each of the plurality of sets of adjusted k-space data by applying a reconstruction algorithm includes:
  inputting each of the plurality of sets of adjusted k-space data into one of the at least two different neural network models to generate its corresponding image.

16. The method of claim 14, wherein the neural network technique includes an artificial neural network (ANN) model.

17. The method of claim 14, wherein determining the optimized k-space data adjustment technique by comparing the plurality of images with the reference image includes:
  for each of the plurality of images, generating a mean square error between pixels of the each image and pixels of the reference image by comparing the each image and the reference image; and
  determining, based on the mean square errors, the optimized k-space data adjustment technique.

18. The method of claim 13, wherein the plurality of k-space data adjustment techniques include a partial Fourier imaging technique, a parallel imaging technique, or a regridding technique.

19. The method of claim 13, wherein obtaining a set of reference k-space data includes:
  sampling the set of reference k-space data according to one or more trajectories including a Cartesian sampling trajectory, a spiral sampling trajectory, or a radial sampling trajectory.

20. A system, comprising:
  at least one storage medium including a set of instructions; and
  at least one processor in communication with the at least one storage medium, wherein when executing the set of instructions, the at least one processor is directed to cause the system to:
    acquire first k-space data that is generated by entering acquired magnetic resonance (MR) data into a plurality of first k-space locations;
    synthesize, based on the first k-space data; second k-space data for a plurality of second k-space locations that are not filled with the acquired MR data; and
    reconstruct an image from the first k-space data and the second k-space data by applying a reconstruction algorithm, wherein the reconstruction algorithm is based at least in part on a neural network technique.

\* \* \* \* \*